(12) United States Patent
Low et al.

(10) Patent No.: US 11,967,667 B2
(45) Date of Patent: Apr. 23, 2024

(54) MICRO LIGHT-EMITTING DIODE STRUCTURE AND MICRO LIGHT-EMITTING DIODE DISPLAY PANEL USING THE SAME

(71) Applicant: PlayNitride Display Co., Ltd., Zhunan Township, Miaoli County (TW)

(72) Inventors: Chee-Yun Low, Zhunan Township (TW); Fei-Hong Chen, Zhunan Township (TW); Pai-Yang Tsai, Zhunan Township (TW)

(73) Assignee: PLAYNITRIDE DISPLAY CO., LTD., Zhunan Township (TW)

( * ) Notice: Subject to any disclaimer, the term of this patent is extended or adjusted under 35 U.S.C. 154(b) by 413 days.

(21) Appl. No.: 17/501,310

(22) Filed: Oct. 14, 2021

(65) Prior Publication Data

US 2022/0344543 A1    Oct. 27, 2022

(30) Foreign Application Priority Data

Apr. 27, 2021    (TW) .................. 110115097

(51) Int. Cl.
*H01L 33/38* (2010.01)
*H01L 25/075* (2006.01)
(Continued)

(52) U.S. Cl.
CPC ............ *H01L 33/387* (2013.01); *H01L 33/20* (2013.01); *H01L 33/62* (2013.01);
(Continued)

(58) Field of Classification Search
CPC ........ H01L 33/387; H01L 33/20; H01L 33/62; H01L 33/32; H01L 33/382; H01L 33/42; H01L 33/46; H01L 25/0753
See application file for complete search history.

(56) References Cited

U.S. PATENT DOCUMENTS

| 2000/0145170 | | 7/2006 | Cho | |
|---|---|---|---|---|
| 2011/0220933 | A1* | 9/2011 | Gotoda | ............... H01L 33/382 257/E33.056 |

(Continued)

FOREIGN PATENT DOCUMENTS

| CN | 101771123 A | 7/2010 |
|---|---|---|
| CN | 201773864 U | 3/2011 |

(Continued)

OTHER PUBLICATIONS

Taiwanese Office Action and Search Report for corresponding Taiwanese Application No. 110115097, dated Apr. 11, 2022.

(Continued)

*Primary Examiner* — Christine A Enad
(74) *Attorney, Agent, or Firm* — Birch, Stewart, Kolasch & Birch, LLP

(57) ABSTRACT

A micro light-emitting diode structure is provided. The micro light-emitting diode structure includes an epitaxial layer. The micro light-emitting diode structure also includes a reflecting layer disposed on the epitaxial layer. The micro light-emitting diode structure further includes a patterned electrode layer disposed between the epitaxial layer and the reflecting layer. The patterned electrode layer is divided into a plurality of patterned electrode segments, and the patterned electrode segments are separated from each other. Moreover, the micro light-emitting diode structure includes a first-type electrode and a second-type electrode disposed on the reflecting layer and electrically connected to the epitaxial layer.

20 Claims, 7 Drawing Sheets

(51) Int. Cl.
*H01L 33/20* (2010.01)
*H01L 33/32* (2010.01)
*H01L 33/42* (2010.01)
*H01L 33/46* (2010.01)
*H01L 33/62* (2010.01)

(52) U.S. Cl.
CPC .......... *H01L 25/0753* (2013.01); *H01L 33/32* (2013.01); *H01L 33/382* (2013.01); *H01L 33/42* (2013.01); *H01L 33/46* (2013.01)

(56) References Cited

U.S. PATENT DOCUMENTS

2014/0070253 A1* 3/2014 Kawase .................. H01L 33/10
257/98
2019/0157513 A1* 5/2019 Chien ..................... H01L 33/22
2023/0327052 A1* 10/2023 Iizuka ................... H01L 33/405
257/99
2023/0378720 A1* 11/2023 Soussan .............. H01S 5/18391

FOREIGN PATENT DOCUMENTS

| CN | 102169939 A | 8/2011 |
| CN | 106611811 A | 5/2017 |
| TW | 201620165 A | 6/2016 |
| TW | 201838205 A | 10/2018 |
| WO | WO 2012/141169 A1 | 10/2012 |
| WO | WO 2014/092448 A1 | 6/2014 |
| WO | WO 2015/070217 A1 | 5/2015 |

OTHER PUBLICATIONS

Chinese Office Action and Search Report for Chinese Application No. 202110460472.5, dated Dec. 5, 2022.

* cited by examiner

MICRO LIGHT-EMITTING DIODE STRUCTURE AND MICRO LIGHT-EMITTING DIODE DISPLAY PANEL USING THE SAME

CROSS REFERENCE TO RELATED APPLICATIONS

This Application claims priority of Taiwan Patent Application No. 110115097, filed on Apr. 27, 2021, the entirety of which is incorporated by reference herein.

BACKGROUND

Technical Field

Embodiments of the present disclosure relate in general to a light-emitting diode structure and a light-emitting diode display panel using the same, and in particular they relate to a micro light-emitting diode structure that includes a patterned electrode layer and a micro light-emitting diode display panel using the same.

Description of the Related Art

With the advancements being made in photoelectric technology, the size of photoelectric components is gradually becoming smaller. Compared to organic light-emitting diodes (OLED), micro light-emitting diodes (micro LED, mLED/μLED) have the advantages of higher efficiency, longer life, and relatively stable materials that are not as easily affected by the environment. Therefore, displays that use micro light-emitting diodes fabricated in arrays have gradually gained attention in the market.

In regular light-emitting diodes, the nitride semiconductor materials of Group IIIA (e.g., GaN, AlN, InN and their alloys, etc.) are often included as light-emitting materials. However, the refractive index of each layer may be different, the light emitted in the regular light-emitting diode may be totally reflected because of total internal reflection, which causes the overall light-emitting efficiency of the micro light-emitting diode structure to decrease.

SUMMARY

Embodiments of the present disclosure relate to a micro light-emitting diode structure that includes a patterned electrode layer and a micro light-emitting diode display panel using the same. The patterned electrode layer is divided into a plurality of patterned electrode segments, and the patterned electrode segments are separated from each other. In some embodiments, the overall light-emitting efficiency of the micro light-emitting diode structure may be further improved by adjusting the size (e.g., height, width, etc.) of the patterned electrode segment or the distance between two adjacent patterned electrode segments.

Some embodiments of the present disclosure include a micro light-emitting diode structure. The micro light-emitting diode structure includes an epitaxial layer. The micro light-emitting diode structure also includes a reflecting layer disposed on the epitaxial layer. The micro light-emitting diode structure further includes a patterned electrode layer disposed between the epitaxial layer and the reflecting layer. The patterned electrode layer is divided into a plurality of patterned electrode segments, and the patterned electrode segments are separated from each other. Moreover, the micro light-emitting diode structure includes a first-type electrode and a second-type electrode disposed on the reflecting layer and electrically connected to the epitaxial layer.

Some embodiments of the present disclosure include a micro light-emitting diode display panel. The micro light-emitting diode display panel includes a driving substrate having a display region and a non-display region. The micro light-emitting diode display panel also includes a plurality of pixels disposed in the display region and arranged in an array. The micro light-emitting diode display panel further includes a plurality of aforementioned micro light-emitting diode structures disposed in the pixels and electrically bonded to the driving substrate.

BRIEF DESCRIPTION OF THE DRAWINGS

Aspects of the embodiments of the present disclosure can be understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
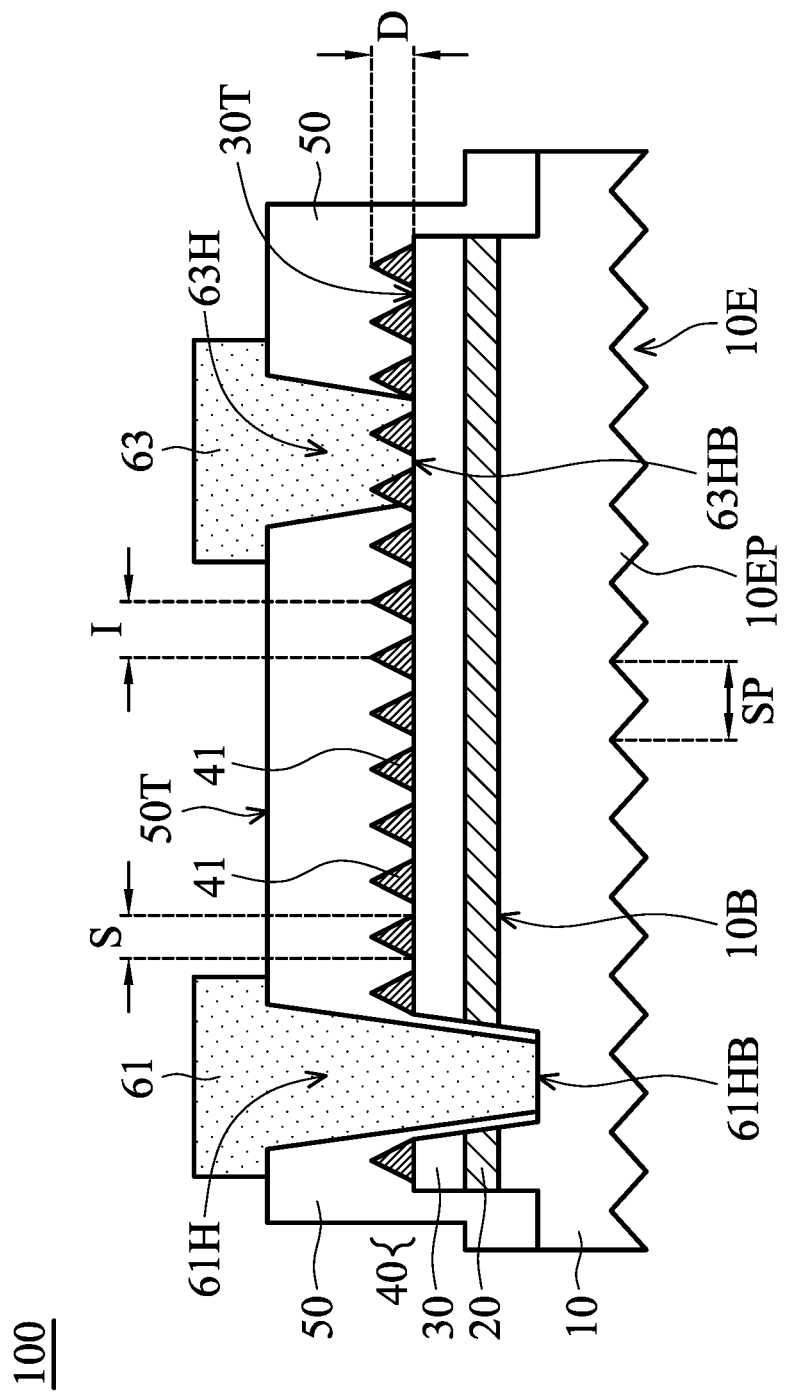
FIG. 1 is a partial cross-sectional view illustrating the micro light-emitting diode structure according to one embodiment of the present disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, a first feature is formed on a second feature in the description that follows may include embodiments in which the first feature and second feature are formed in direct contact, and may also include embodiments in which additional features may be formed between the first feature and second feature, so that the first feature and second feature may not be in direct contact.

It should be understood that additional steps may be implemented before, during, or after the illustrated methods, and some steps might be replaced or omitted in other embodiments of the illustrated methods.

Furthermore, spatially relative terms, such as "beneath," "below," "lower," "on," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, the terms "about," "approximately" and "substantially" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. That is, when there is no specific description of the terms "about," "approximately" and "substantially", the stated value includes the meaning of "about," "approximately" or "substantially".

Unless otherwise defined, all terms (including technical and scientific terms) used herein have the same meaning as commonly understood by one of ordinary skill in the art to which this disclosure belongs. It should be understood that terms such as those defined in commonly used dictionaries should be interpreted as having a meaning that is consistent with their meaning in the context of the relevant art and will not be interpreted in an idealized or overly formal sense unless expressly so defined in the embodiments of the present disclosure.

The present disclosure may repeat reference numerals and/or letters in following embodiments. This repetition is for the purpose of simplicity and clarity and does not in itself dictate a relationship between the various embodiments and/or configurations discussed.

Figure 2:
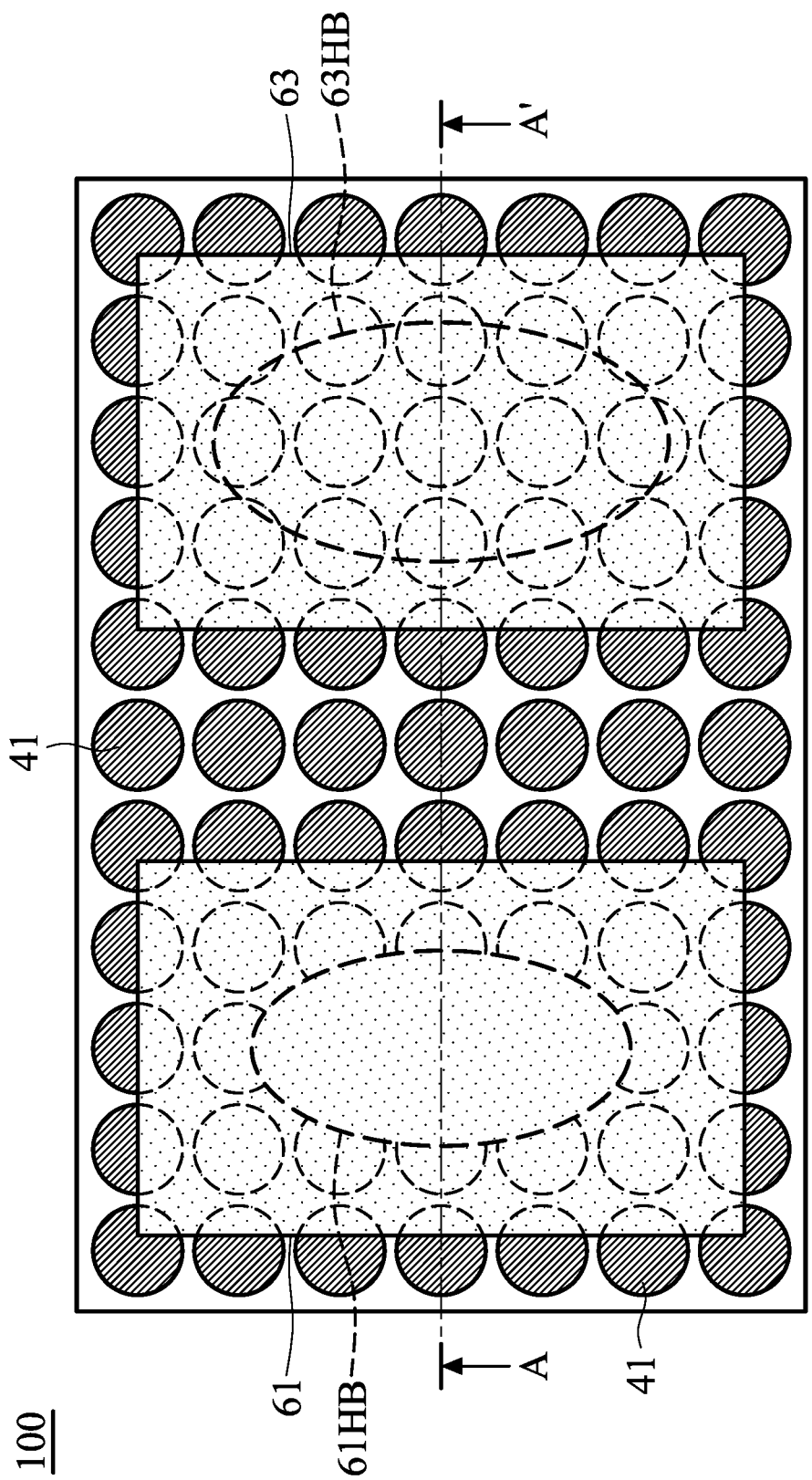
FIG. 2 is a partial top view illustrating the micro light-emitting diode structure according to one embodiment of the present disclosure.

FIG. 1 is a partial cross-sectional view illustrating the micro light-emitting diode structure 100 according to one embodiment of the present disclosure. FIG. 2 is a partial top view illustrating the micro light-emitting diode structure 100 according to one embodiment of the present disclosure. For example, FIG. 1 may be the cross-sectional view of the micro light-emitting diode structure 100 along line A-A' in FIG. 2, but the present disclosure is not limited thereto. It should be noted that some components of the micro light-emitting diode structure 100 have been omitted in FIG. 1 and FIG. 2 for sake of brevity.

Referring to FIG. 1, in some embodiments, the micro light-emitting diode structure 100 includes a first-type semiconductor layer 10, a light-emitting layer 20, and a second-type semiconductor layer 30, the light-emitting layer 20 is disposed on the first-type semiconductor layer 10, and the second-type semiconductor layer 30 is disposed on the light-emitting layer 20. In some embodiments, the first-type semiconductor layer 10 has a first conductivity type (e.g., N-type), and the second-type semiconductor layer 30 has a second conductivity type (e.g., P-type) which is the opposite of the first conductivity type.

In some embodiments, the first-type semiconductor layer 10, the light-emitting layer 20, and the second-type semiconductor layer 30 are referred to as an epitaxial layer of the micro light-emitting diode structure 100. That is, the first-type semiconductor layer 10, the light-emitting layer 20, and the second-type semiconductor layer 30 may be formed on a substrate by an epitaxial growth process. For example, the epitaxial growth process may include metal organic chemical vapor deposition (MOCVD), hydride vapor phase epitaxy (HVPE), molecular beam epitaxy (MBE), any other applicable method, or a combination thereof, but the present disclosure is not limited thereto.

The aforementioned substrate may be a semiconductor substrate. For example, the substrate may include silicon, silicon germanium, gallium nitride, gallium arsenide, any other applicable semiconductor material, or a combination thereof. The substrate may also be a semiconductor-on-insulator substrate, such as a silicon-on-insulator (SOI) substrate. Alternately, the substrate may be a glass substrate or a ceramic substrate. For example, the substrate may include silicon carbide (SiC), aluminum nitride (AlN), glass, or sapphire, but the present disclosure is not limited thereto.

In some embodiments, the dopant of the first-type semiconductor layer 10 is N-type. For example, the first-type semiconductor layer 10 may include a group II-VI material (e.g., zinc selenide (ZnSe)) or a group III-V compound material (e.g., gallium nitride (GaN), aluminum nitride (AlN), indium nitride (InN), indium gallium nitride (InGaN), aluminum gallium nitride (AlGaN) or aluminum indium gallium nitride (AlInGaN)), and the first-type semiconductor layer 10 may include dopants such as silicon (Si) or germanium (Ge), but the present disclosure is not limited thereto. In the embodiments of the present disclosure, the first-type semiconductor layer 10 may be a single-layer or multi-layer structure.

In some embodiments, the light-emitting layer 20 includes at least one undoped semiconductor layer or at least one low-doped layer. For example, the light-emitting layer 20 may include a quantum well (QW) layer, which may include indium gallium nitride ($In_xGa_{1-x}N$) or gallium nitride (GaN), but the present disclosure is not limited thereto. In some embodiments, the light-emitting layer 20 includes a multiple quantum well (MQW) layer.

In some embodiments, the dopant of the second-type semiconductor layer 30 is P-type. For example, the second-type semiconductor layer 30 may include a group II-VI material (e.g., zinc selenide (ZnSe)) or a group III-V compound material (e.g., gallium nitride (GaN), aluminum nitride (AlN), indium nitride (InN), indium gallium nitride (InGaN), aluminum gallium nitride (AlGaN) or aluminum indium gallium nitride (AlInGaN)), and the second-type semiconductor layer 30 may include dopants such as magnesium (Mg) or carbon (C), but the present disclosure is not limited thereto. In the embodiment of the present disclosure, the second-type semiconductor layer 30 may be a single-layer or multi-layer structure.

As shown in FIG. 1, the first-type semiconductor layer 10 has a patterned light-emitting surface 10E and a back surface 10B opposite the patterned light-emitting surface 10E. The light-emitting layer 20 is formed on the back surface 10B of the first-type semiconductor layer 10 and disposed between the first-type semiconductor layer 10 and the second-type semiconductor layer 30. The patterned light-emitting surface 10E that has a plurality of patterns 10EP may be formed, for example, by a surface roughening treatment, but the present disclosure is not limited thereto. The patterned light-emitting surface 10E may further improve the overall light-emitting efficiency of the micro light-emitting diode structure 100.

Referring to FIG. 1, the micro light-emitting diode structure 100 includes a patterned electrode layer 40 disposed on the second-type semiconductor layer 30 of the epitaxial layer. In more detail, the patterned electrode layer 40 may be in direct contact with a surface 30T of the second-type semiconductor layer 30, and the second-type semiconductor layer 30 is disposed between the patterned electrode layer 40 and the light-emitting layer 20. The patterned electrode layer 40 may include a transparent conductive material. For example, the transparent conductive material may include indium tin oxide (ITO), tin oxide (TO), indium zinc oxide (IZO), indium gallium zinc oxide (IGZO), indium zinc tin oxide (ITZO), antimony tin oxide (ATO), or antimony zinc oxide (AZO), but the present disclosure is not limited thereto.

The patterned electrode layer 40 may be formed on the second-type semiconductor layer 30 by a deposition process and a patterning process. For example, the deposition process may include chemical vapor deposition (CVD), atomic layer deposition (ALD), any other applicable method, or a combination thereof, but the present disclosure is not limited thereto. Moreover, a mask layer (not shown) may be provided on the aforementioned transparent conductive material, and then the mask layer is used as an etching mask to perform an etching process to complete the patterning process.

For example, the mask layer may include a photoresist, such as a positive photoresist or a negative photoresist. The mask layer may include a hard mask and may be formed of silicon oxide ($SiO_2$), silicon nitride (SiN), silicon oxynitride (SiON), silicon carbide (SiC), silicon carbonitride (SiCN), the like, or a combination thereof, but the present disclosure is not limited thereto. The mask layer may be a single-layer or multi-layer structure. The mask layer may be formed by a deposition process, a photolithography process, any other applicable process, or a combination thereof. For example, the deposition process may include spin-on coating, chemical vapor deposition (CVD), atomic layer deposition (ALD), the like, or a combination thereof. The photolithography process may include photoresist coating (e.g., spin coating), soft baking, mask aligning, exposure, post-exposure baking (PEB), developing, rinsing, drying (e.g., hard baking), any other applicable processes, or a combination thereof.

The aforementioned etching process may include a dry etching process, a wet etching process, or a combination thereof. For example, the dry etching process may include reactive ion etch (RIE), inductively-coupled plasma (ICP) etching, neutral beam etch (NBE), electron cyclotron resonance (ERC) etching, the like, or a combination thereof. For example, the wet etching process may use, for example, hydrofluoric acid (HF), ammonium hydroxide ($NH_4OH$), or any suitable etchant.

As shown in FIG. 1 and FIG. 2, the patterned electrode layer 40 is divided into a plurality of patterned electrode segments 41, and the patterned electrode segments 41 are separated from each other. The plurality of patterned electrode segments 41 of the patterned electrode layer 40 may exhibit a regular periodic arrangement (e.g., an array arrangement) and be formed on the epitaxial layer, but the present disclosure is not limited thereto.

In the embodiment shown in FIG. 1, the patterned electrode segments 41 may be formed as a cone (presented as a triangle in the cross-sectional view), but the present disclosure is not limited thereto. For example, the patterned electrode segments 41 may also be formed as a cylinder, an island, etc., which may be adjusted according to actual needs.

As shown in FIG. 1, in some embodiments, the height D of each patterned electrode segment 41 is from about 0.01 μm to about 2 μm. In some embodiments, the width S of the bottom surface of each patterned electrode segment 41 is from about 0.5 μm to about 5 μm. In some embodiments, the arrangement pitches I of the patterned electrode segments 41 are constant (i.e., the plurality of patterned electrode segments 41 exhibits a regular periodic arrangement), and the arrangement pitch I may range from about 0.5 μm to about 20 μm. Here, the arrangement pitch I is defined as the distance between the central axes of two adjacent patterned electrode segments 41. In some other embodiments, the arrangement pitches I of the patterned electrode segments are variable.

The plurality of patterned electrode segments 41 of the patterned electrode layer 40 may reduce the dispersion, so the size of the patterned electrode segment (e.g., the height D, the width S, etc.) or the arrangement pitch I of the patterned electrode segments 41 may be adjusted to improve the overall light-emitting efficiency of the micro light-emitting diode structure 100. In some embodiments, the size of each patterned electrode segment 41 is smaller than the size of each pattern 10EP of the patterned light-emitting surface 10E. For example, the width S of each patterned electrode segment 41 is less than the width SP of the pattern 10EP of the patterned light-emitting surface 10E.

In some embodiments, the patterned electrode segment 41 in different micro light-emitting diode structures 100 for emitting different color lights has different sizes. For example, when the light-emitting layer 20 emits red light, the height D of each patterned electrode segment 41 may range from about 0.48 μm to about 1.2 μm, the width S of the bottom surface of each patterned electrode segment 41 may range from about 0.6 μm to about 1.2 μm, and the arrangement pitch I of the patterned electrode segments 41 may range from about 0.5 μm to about 20 μm; when the light-emitting layer 20 emits blue light, the height D of each patterned electrode segment 41 may range from about 0.35 μm to about 1 μm, the width S of the bottom surface of each patterned electrode segment 41 may range from about 0.5 μm to about 1 μm, and the arrangement pitch I of the patterned electrode segments 41 may range from about 0.5 μm to about 20 μm; when the light-emitting layer 20 emits green light, the height D of each patterned electrode segment 41 may range from about 0.4 μm to about 1 μm, the width S of the bottom surface of each patterned electrode segment 41 may range from about 0.55 μm to about 1 μm, and the arrangement pitch I of the patterned electrode segments 41 may range from about 0.5 μm to about 20 μm.

Referring to FIG. 1, the micro light-emitting diode structure 100 includes a reflecting layer 50 disposed on the patterned electrode layer 40. In other words, the reflecting layer 50 is also disposed on the epitaxial layer and opposite the patterned light-emitting surface 10E, and the patterned electrode layer 40 is disposed between the epitaxial layer and the reflecting layer 50. In some embodiments, the reflecting layer 50 includes a distributed Bragg reflector (DBR). In some embodiments, the reflecting layer 50 is formed by stacking multiple layers of insulating materials with different refractive indexes. In more detail, the reflecting layer 50 is formed on the first-type semiconductor layer 10 and the second-type semiconductor layer 30, and covers the side surfaces of the light-emitting layer 20 and the second-type semiconductor layer 30. Therefore, the side surfaces of the light-emitting layer 20 and the second-type semiconductor layer 30 are protected by the reflecting layer 50 as shown in FIG. 1, and the electrical leakage path may be reduced and the light-emitting efficiency may be improved.

For example, when the light emitted by the light-emitting layer 20 passes through the thin films having different refractive indexes in the reflective layer 50, the lights reflected by the thin films generate constructive interference due to the change of the phase angle. Then, the lights reflected by the thin films combine with each other to obtain a strong reflected light, so that the strong reflected light is emitted through the patterned light-emitting surface 10E of the first-type semiconductor layer 10, thereby increasing the light-emitting efficiency of the micro light-emitting diode structure 100. The reflecting layer 50 may be formed on the patterned electrode layer 40 by a deposition process (and a patterning process), but the present disclosure is not limited thereto. Examples of the deposition process (and the patterning process) are described above, and will not be repeated here.

The reflecting layer 50 may have a flat top surface 50T, but the present disclosure is not limited thereto. The reflecting layer 50 has a contact surface that is in contact with the patterned electrode layer 40 (the patterned electrode segments 41), and the top surface 50T is located on the opposite side of the contact surface.

Referring to FIG. 1, in some embodiments, the micro light-emitting diode structure 100 includes a first-type electrode 61 and a second-type electrode 63 disposed on the top surface 50T of the reflecting layer 50 and electrically connected to the epitaxial layer. In particular, the second-type semiconductor layer 30, the patterned electrode layer 40, a portion of the reflecting layer 50, a portion of the first-type electrode 61, and the second-type electrode 63 are disposed on the same side of the light-emitting layer 20, while the first-type semiconductor layer 10 is disposed on another side of the light-emitting layer 20.

The first-type electrode 61 and the second-type electrode 63 may include metal, metal silicide, the like, or a combination thereof. For example, the metal may include gold (Au), nickel (Ni), platinum (Pt), palladium (Pd), iridium (Ir), titanium (Ti), chromium (Cr), tungsten (W), aluminum (Al), copper (Cu), the like, an alloy thereof, or a combination thereof, but the present disclosure is not limited thereto. The first-type electrode 61 and the second-type electrode 63 may be formed by physical vapor deposition (PVD), chemical vapor deposition (CVD), atomic layer deposition (ALD, evaporation, sputtering, the like, or a combination thereof, but the present disclosure is not limited thereto.

The first-type electrode 61 is electrically connected to the first-type semiconductor layer 10, and the second-type electrode 63 is electrically connected to the second-type semiconductor layer 30. In particular, as shown in FIG. 1 and FIG. 2, the micro light-emitting diode structure 100 has a through hole 61H that penetrates the reflecting layer 50, the second-type semiconductor layer 30, and the light-emitting layer 20, and exposes a portion of the first-type semiconductor layer 10, and the first-type electrode 61 is disposed in the through hole 61H and is in direct contact with the first-type semiconductor layer 10, so that the first-type electrode 61 is electrically connected to the first-type semiconductor layer 10. That is, the bottom 61HB of the through hole 61H may be inside the first-type semiconductor layer 10 or on the back surface 10B of the first-type semiconductor layer 10.

The micro light-emitting diode structure 100 also has a through hole 63H that penetrates the reflecting layer 50 and exposes a portion of the patterned electrode layer 40 (i.e., some patterned electrode segments 41) and a portion of the second-type semiconductor layer 30, and the second-type electrode 63 is disposed in the through hole 63H and is in direct contact with the portion of the patterned electrode layer 40, so that the second-type electrode 63 is electrically connected to the second-type semiconductor layer 30. That is, the bottom 63HB of the through hole 63H may be on the surface 30T of the second-type semiconductor layer 30 and may be in direct contact with some patterned electrode segments 41. As shown in FIG. 1 and FIG. 2, there are some patterned electrode segments 41 disposed in the through hole 63H, but there is no patterned electrode segments 41 disposed in the through hole 61H.

As shown in FIG. 2, the patterned electrode segments 41 of the patterned electrode layer 40 are formed into an array, and the patterned electrode segments 41 are separated from each other. That is, the patterned electrode layer 40 may be formed as discontinuous electrodes. These discontinuous electrodes may limit the current distribution, thereby controlling the current in-put density between the second-type electrode 63 and the second-type semiconductor layer 30.

In some embodiments, the ratio of the contact area between the portion of the patterned electrode layer 40 and the second-type semiconductor layer 30 in the through hole 63H to the bottom area of the through hole 63H (i.e., the area of the bottom 63HB of the through hole 63H) is between 0.5% and 85%. In some embodiments, the ratio is better between 40% and 60%. If the contact area between the portion of the patterned electrode layer 40 and the second-type semiconductor layer 30 is too small, the problem of current crowding will be caused, and the micro light-emitting diode structure may be overheated; if the contact area is too large, the current-limiting effect cannot be achieved, and the light-emitting efficiency of the micro light-emitting diode structure cannot be further improved.

Figure 3:
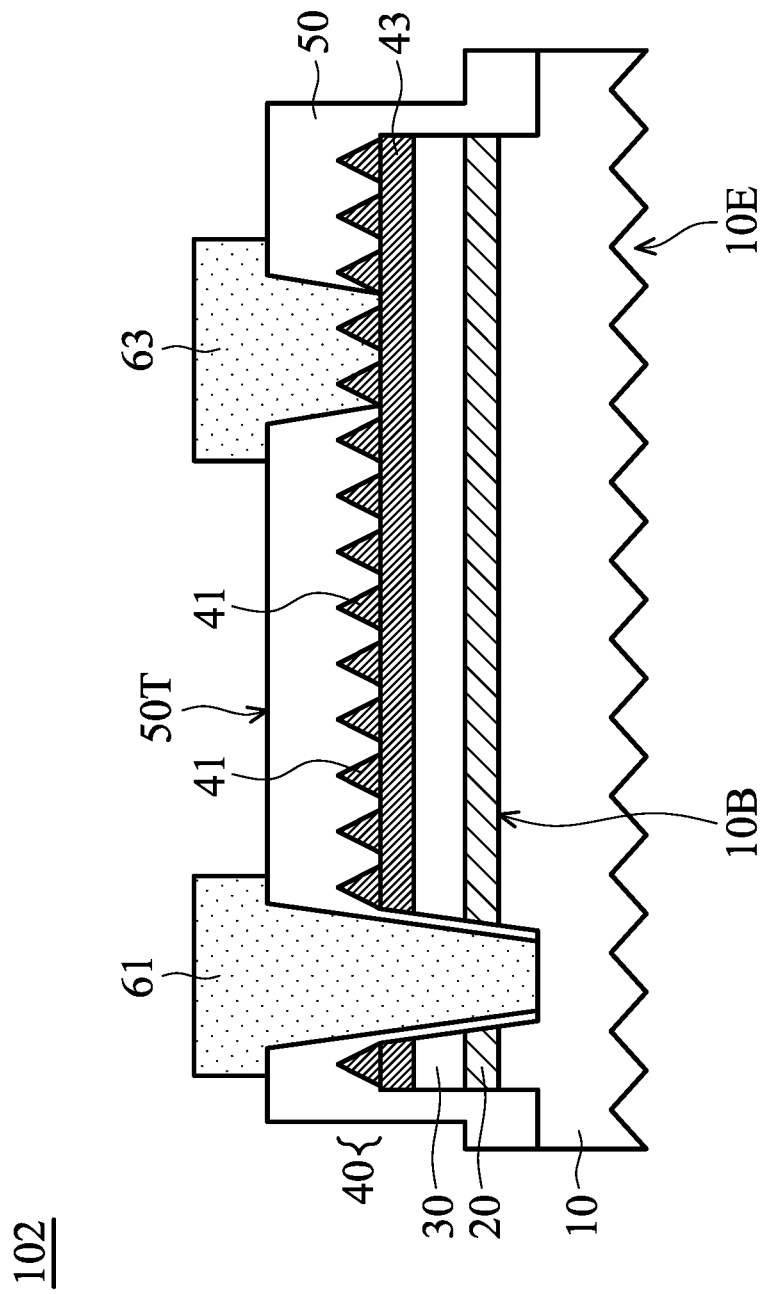
FIG. 3 is a partial cross-sectional view illustrating the micro light-emitting diode structure according to another embodiment of the present disclosure.
Figure 4:
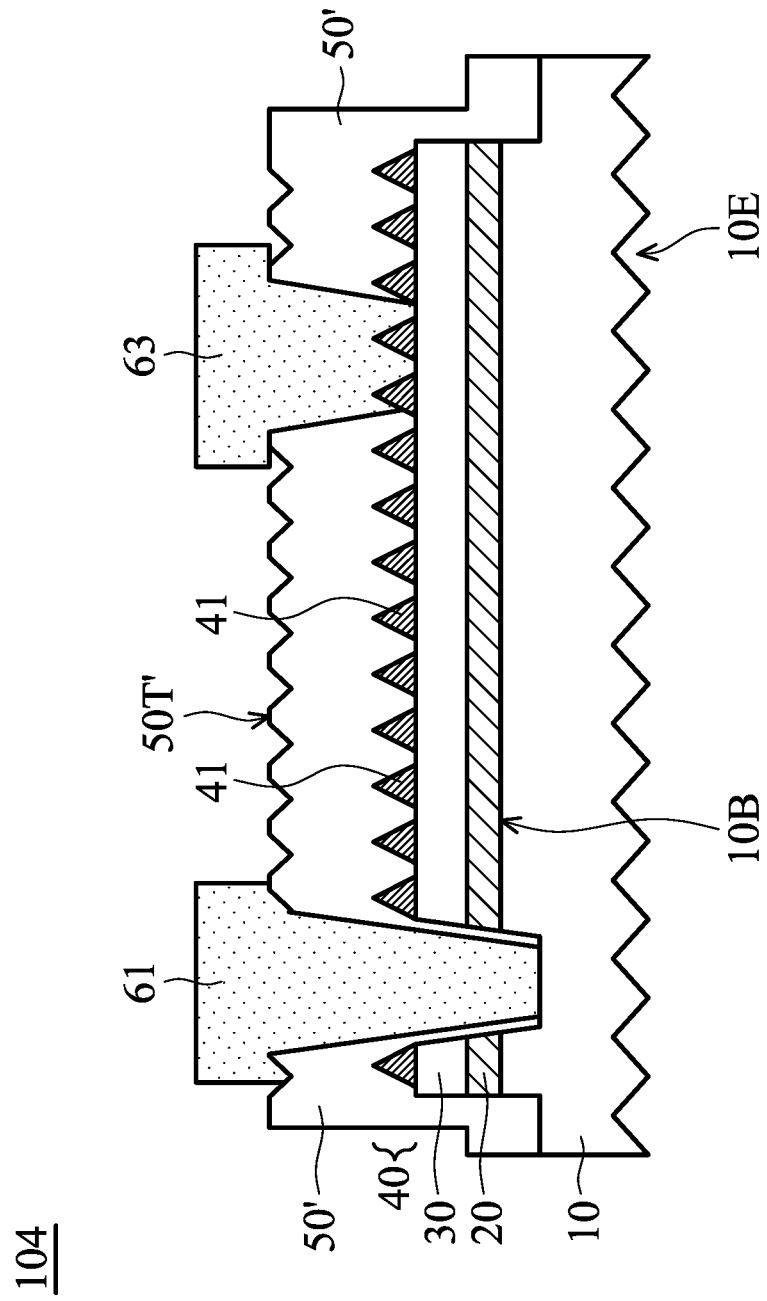
FIG. 4 is a partial cross-sectional view illustrating the micro light-emitting diode structure according to another embodiment of the present disclosure.
Figure 5:
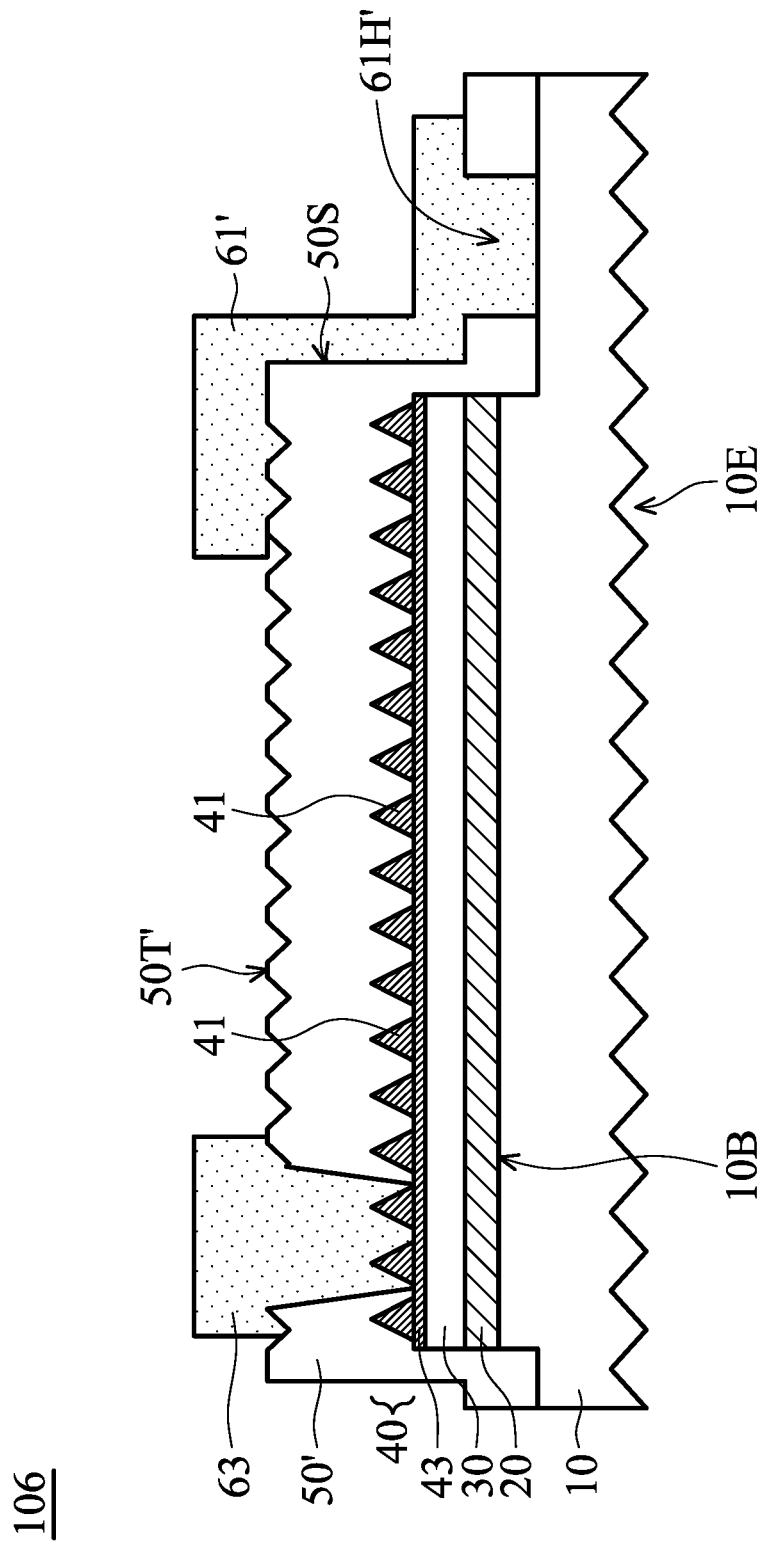
FIG. 5 is a partial cross-sectional view illustrating the micro light-emitting diode structure according to another embodiment of the present disclosure.

FIG. 3 is a partial cross-sectional view illustrating the micro light-emitting diode structure 102 according to another embodiment of the present disclosure. FIG. 4 is a partial cross-sectional view illustrating the micro light-emitting diode structure 104 according to another embodiment of the present disclosure. FIG. 5 is a partial cross-sectional view illustrating the micro light-emitting diode structure 106 according to another embodiment of the present disclosure. Similarly, some components of the micro light-emitting diode structure 102, the micro light-emitting diode structure 104, or the micro light-emitting diode structure 106 have been omitted in FIG. 3 to FIG. 5 for sake of brevity.

Referring to FIG. 3, in some embodiments, the micro light-emitting diode structure 102 further includes a conductive film 43 disposed between the epitaxial layer (e.g., the second-type semiconductor layer 30) and the patterned electrode layer 40, and the conductive film 43 is laid on the second-type semiconductor layer 30 of the epitaxial layer. In particular, the conductive film 43 is a continuous and complete film, and the bottom of the plurality of patterned electrode segments 41 of the patterned electrode 40 is formed on and connected with the conductive film 43, but the present disclosure is not limited thereto.

In some embodiments, the material of the conductive film 43 is the same as or similar to that of the patterned electrode layer 40. For example, the conductive film 43 may include a transparent conductive material. Examples of the transparent conductive material are described above, and will not be repeated here. Moreover, the conductive film 43 may be formed on the second-type semiconductor layer 30 by a deposition process. Examples of the deposition process are described above, and will not be repeated here. In some embodiments, the conductive film 43 and the patterned electrode layer 40 may be formed simultaneously by the same process (e.g., a deposition process and a patterning process), but the present disclosure is not limited thereto.

In FIG. 3, the reflecting layer 50 has a flat top surface 50T, but the present disclosure is not limited thereto. Referring to FIG. 4, in some embodiments, the reflecting layer 50' of the micro light-emitting diode structure 104 has a rough top surface 50T'. Here, as shown in FIG. 4, the reflecting layer 50' has a contact surface that is in contact with the patterned electrode layer 40 (the patterned electrode segments 41), and the rough top surface 50T' is on the opposite side of the contact surface. In other words, the reflecting layer 50' has the rough top surface 50T' opposite the patterned electrode layer 40. Similarly, the rough top surface 50T' may be formed by a pattering process or a surface roughening treatment, but the present disclosure is not limited thereto. Due to the reflective ability of the rough top surface 50T' of the reflective layer 50', the overall light-emitting efficiency of the micro light-emitting diode structure 104 may be further improved.

Referring to FIG. 5, in some embodiments, the reflective layer 50' of the micro light-emitting diode structure 106 extends to and covers the first-type semiconductor layer 10. Moreover, the through hole 61H' only needs to penetrate the reflecting layer 50' to expose a portion of the first-type semiconductor layer 10. The first-type electrode 61' is disposed on the top surface 50T' of the reflecting layer 50', and the first-type electrode 61' also extends to and covers a side surface 50S of the reflecting layer 50', and extends into the through hole 61H' and is in direct contact with the first-type semiconductor layer 10, so that the first-type electrode 61' is electrically connected to the first-type semiconductor layer 10.

Figure 6:
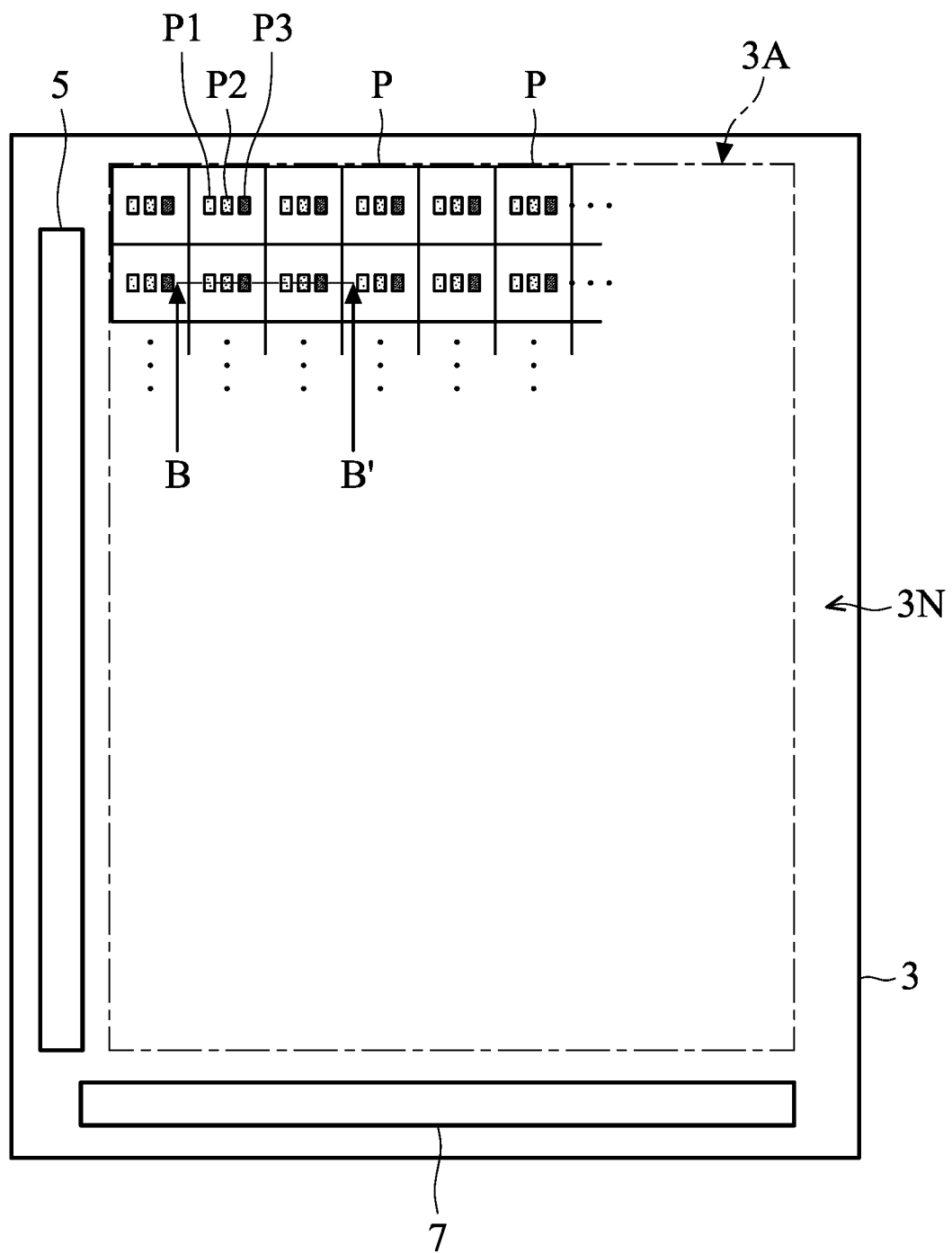
FIG. 6 is a partial top view illustrating the micro light-emitting diode display panel according to one embodiment of the present disclosure.
Figure 7:
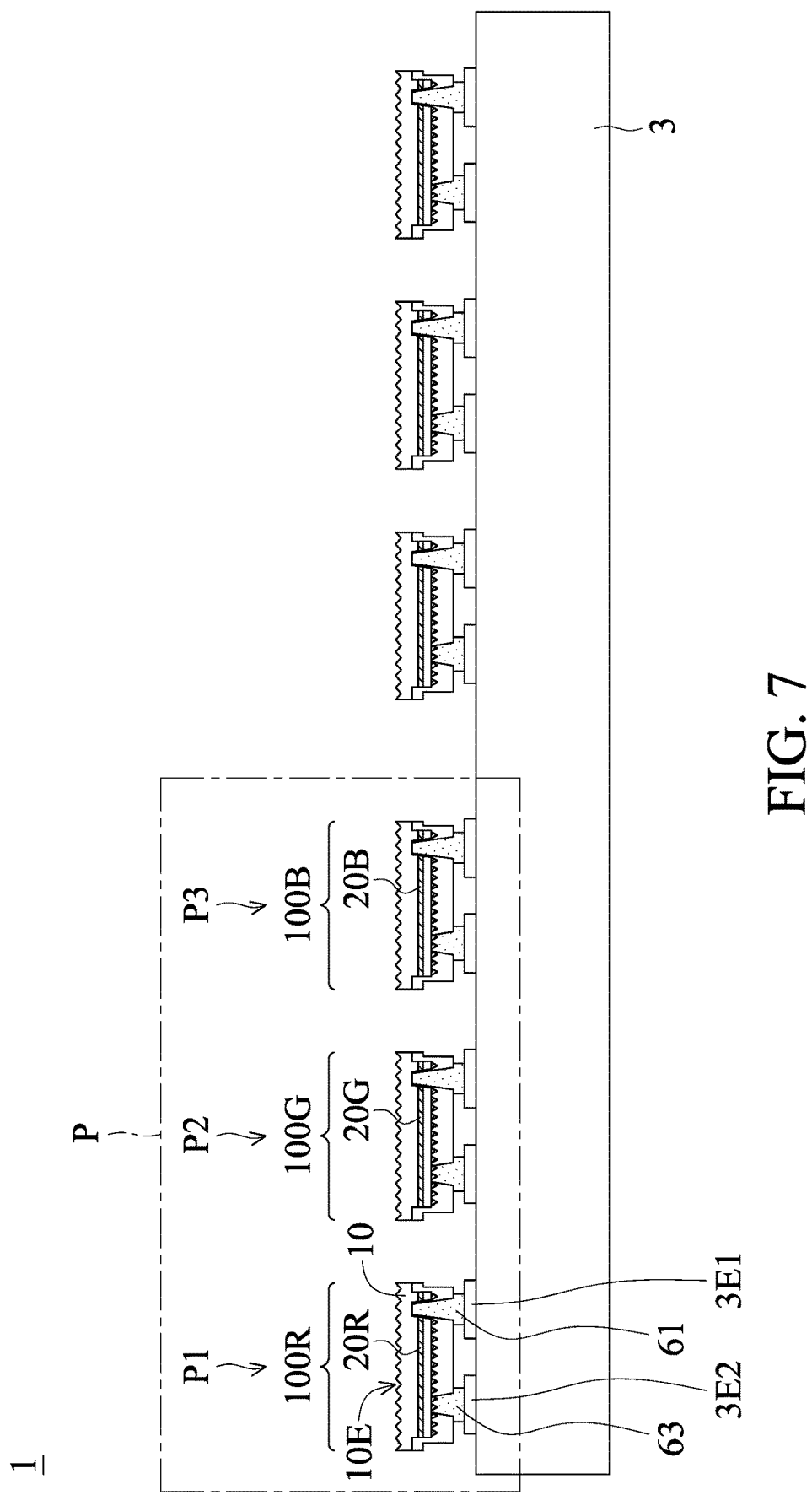
FIG. 7 is a partial cross-sectional view illustrating the micro light-emitting diode display panel according to one embodiment of the present disclosure.

FIG. 6 is a partial top view illustrating the micro light-emitting diode display panel 1 according to one embodiment of the present disclosure. FIG. 7 is a partial cross-sectional view illustrating the micro light-emitting diode display panel 1 according to one embodiment of the present disclosure. For example, FIG. 7 may be the cross-sectional view of the micro light-emitting diode display panel 1 along line B'B' in FIG. 6, but the present disclosure is not limited thereto. It should be noted that some components of the micro light-emitting diode display panel 1 have been omitted in FIG. 6 and FIG. 7 for sake of brevity.

Referring to FIG. 6 and FIG. 7, the micro light-emitting diode display panel 1 includes a driving substrate 3 and a plurality of pixels P. The driving substrate 3 has a display region 3A and a non-display region 3N, and the pixels are disposed in the display region 3A and arranged in an array. Each pixel P includes three sub-pixels (e.g., sub-pixel P1, sub-pixel P2, and sub-pixel P3), but the present disclosure is not limited thereto. In some other embodiments, each pixel P includes more than three sub-pixels, which may be adjusted according to actual needs.

The micro light-emitting diode display panel 1 includes a scan driving circuit 5 and a data driving circuit 7, and the scan driving circuit 5 and the data driving circuit 7 are disposed in the non-display region 3N. The micro light-emitting diode display panel 1 includes a pixel circuit in the display region 3A, and the pixel circuit includes a plurality of electrode pads 3E1 and electrode pads 3E2 arranged in each of the sub-pixels. The micro light-emitting diode display panel 1 includes a plurality of micro light-emitting diode structures (e.g., 100R, 100G, 100B) disposed in the pixels P and electrically bonded to the driving substrate 3, so that the scan driving circuit 5 and the data driving circuit 7 may be electrically connected to the micro light-emitting diode structures by the pixel circuit (e.g., the electrode pads 3E1 and the electrode pads 3E2).

In more detail, the micro light-emitting diode structure 100R is disposed in the sub-pixel P1 of the pixel P. and the micro light-emitting diode structure 100R is bonded on the driving substrate 3 by bonding the electrode pad 3E1 with the first-type electrode 61 of the micro light-emitting diode structure 100R and bonding the electrode pad 3E2 with the second-type electrode 63 of the micro light-emitting diode structure 100R. For example, the light-emitting layer 20R of the micro light-emitting diode structure 100R may emit red light. In other words, the micro light-emitting diode structure 100R may be a micro red-light diode, but the present disclosure is not limited thereto.

Similarly, the micro light-emitting diode structure 100G is disposed in the sub-pixel P2 of the pixel P, and the micro light-emitting diode structure 100B is disposed in the sub-pixel P3 of the pixel P. The micro light-emitting diode structure 100G and the micro light-emitting diode structure 100B may be bonded on the driving substrate 3 by the electrode pads 3E1 and the electrode pads 3E2. For example, the light-emitting layer 20G of the micro light-emitting diode structure 100G may emit green light, and the light-emitting layer 20B of the micro light-emitting diode structure 100B may emit blue light. In other words, the micro light-emitting diode structure 100G may be a micro green-light diode, and the micro light-emitting diode structure 100B may be a micro blue-light diode, but the present disclosure is not limited thereto.

As shown in FIG. 7, Each pixel P may have a micro light-emitting diode structure 100R (corresponding to sub-pixel P1), a micro light-emitting diode structure 100G (corresponding to sub-pixel P2), and a micro light-emitting diode structure 100B (corresponding to sub-pixel P3) that respectively emit red light, green light, and blue light. These micro light-emitting diode structures are transferred and bonded on the electrode pads 3E1 and 3E2 of the pixel circuit.

In some embodiments, the micro light-emitting diode structure 100R the micro light-emitting diode structure 100G, and the micro light-emitting diode structure 100B are similar to the micro light-emitting diode structure 100 shown in FIG. 1, but the present disclosure is not limited thereto. In some other embodiments, the micro light-emitting diode structure 100R, the micro light-emitting diode structure 100G, and the micro light-emitting diode structure 100B are similar to the micro light-emitting diode structure 102 shown in FIG. 3, the micro light-emitting diode structure 104 shown in FIG. 4, or the micro light-emitting diode structure 106 shown in FIG. 5.

Furthermore, the patterned light-emitting surface 10E of the first-type semiconductor layer 10 of the micro light-emitting diode structure may be referred to as the display surface of the micro light-emitting diode display panel 1, and the patterned light-emitting surface 10E is opposite the driving substrate 3 as shown in FIG. 7. Therefore, compared with traditional display panels, the micro light-emitting diode display panel 1 according to the embodiments of the present disclosure has higher brightness and higher light-emitting efficiency, and is particularly suitable for use in outdoor display devices or transparent display devices.

In summary, the patterned electrode layer of the micro light-emitting diode structure according to the embodiments of the present disclosure is divided into a plurality of patterned electrode segments, and the patterned electrode segments are separated from each other. In some embodiments, the overall light-emitting efficiency of the micro light-emitting diode structure may be further improved by adjusting the size (e.g., height, width, etc.) of the patterned electrode segment or the distance between two adjacent patterned electrode segments. Furthermore, the micro light-emitting diode display panel that uses the micro light-emitting diode structure according to the embodiments of the present disclosure may have higher brightness and higher light-emitting efficiency.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. Therefore, the scope of protection should be determined through the claims. In addition, although some embodiments of the present disclosure are disclosed above, they are not intended to limit the scope of the present disclosure.

Reference throughout this specification to features, advantages, or similar language does not imply that all of the features and advantages that may be realized with the present disclosure should be or are in any single embodiment of the disclosure. Rather, language referring to the features and advantages is understood to mean that a specific feature, advantage, or characteristic described in connection with an embodiment is included in at least one embodiment of the present disclosure. Thus, discussions of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the relevant art will recognize, in light of the description herein, that the disclosure can be practiced without one or more of the specific features or advantages of a particular embodiment. In other instances, additional features and advantages may be recognized in certain embodiments that may not be present in all embodiments of the disclosure.

What is claimed is:

1. A micro light-emitting diode structure, comprising:
an epitaxial layer;
a reflecting layer disposed on the epitaxial layer;
a patterned electrode layer disposed between the epitaxial layer and the reflecting layer, wherein the patterned electrode layer is divided into a plurality of patterned electrode segments, and the patterned electrode segments are separated from each other; and
a first-type electrode and a second-type electrode disposed on the reflecting layer and electrically connected to the epitaxial layer.

2. The micro light-emitting diode structure according to claim 1, wherein the epitaxial layer comprises:
a first-type semiconductor layer having a first conductivity type;
a light-emitting layer disposed on the first-type semiconductor layer; and
a second-type semiconductor layer disposed on the light-emitting layer and having a second conductivity type that is the opposite of the first conductivity type,
wherein the first-type electrode is electrically connected to the first-type semiconductor layer, and the second-type electrode is electrically connected to the second-type semiconductor layer.

3. The micro light-emitting diode structure according to claim 2, wherein the micro light-emitting diode structure has a first through hole that penetrates the reflecting layer and exposes a portion of the first-type semiconductor layer, and the first-type electrode is disposed in the first through hole and is in direct contact with the first-type semiconductor layer.

4. The micro light-emitting diode structure according to claim 3, wherein the second-type semiconductor layer, the patterned electrode layer, a portion of the reflecting layer, a portion of the first-type electrode, and the second-type electrode are disposed on one side of the light-emitting layer, the first-type semiconductor layer is disposed on another side of the light-emitting layer, and the first through hole penetrates the second-type semiconductor layer and the light-emitting layer and exposes a portion of the first-type semiconductor layer.

5. The micro light-emitting diode structure according to claim 3, wherein the first-type electrode extends to and covers a side surface of the reflecting layer.

6. The micro light-emitting diode structure according to claim 2, wherein the micro light-emitting diode structure has a second through hole that penetrates the reflecting layer and exposes a portion of the patterned electrode layer and a portion of the second-type semiconductor layer, and the second-type electrode is disposed in the second through hole and is in direct contact with the portion of the patterned electrode layer.

7. The micro light-emitting diode structure according to claim 6, wherein a ratio of a contact area between the portion of the patterned electrode layer and the second-type semiconductor layer to a bottom area of the second through hole is between 40% and 60%.

8. The micro light-emitting diode structure according to claim 2, wherein the first-type semiconductor layer has a patterned light-emitting surface and a back surface opposite the patterned light-emitting surface, and the light-emitting layer is disposed on the back surface.

9. The micro light-emitting diode structure according to claim 8, wherein a size of each of the patterned electrode segments is smaller than a size of a pattern of the patterned light-emitting surface.

10. The micro light-emitting diode structure according to claim 9, wherein a width of each patterned electrode segment is less than a width of the pattern of the patterned light-emitting surface.

11. The micro light-emitting diode structure according to claim 2, wherein the reflecting layer has a rough top surface opposite the patterned electrode layer, and the first-type semiconductor layer has a patterned light-emitting surface.

12. The micro light-emitting diode structure according to claim 1, further comprising:
a conductive film disposed between the epitaxial layer and the patterned electrode layer, wherein the conductive film is a complete layer and laid on the epitaxial layer.

13. The micro light-emitting diode structure according to claim 12, wherein the patterned electrode layer and the conductive film comprises indium tin oxide, tin oxide, indium zinc oxide, indium gallium zinc oxide, indium zinc tin oxide, antimony tin oxide, or antimony zinc oxide.

14. The micro light-emitting diode structure according to claim 1, wherein a height of each of the patterned electrode segments is from 0.01 μm to 2 μm.

15. The micro light-emitting diode structure according to claim 1, wherein a width of a bottom surface of each of the patterned electrode segments is from 0.5 μm to 5 μm.

16. The micro light-emitting diode structure according to claim 1, wherein an arrangement pitch of the patterned electrode segments is from 0.5 μm to 20 μm.

17. The micro light-emitting diode structure according to claim 1, wherein the reflecting layer comprises a distributed Bragg reflector.

18. A micro light-emitting diode display panel, comprising:
- a driving substrate having a display region and a non-display region;
- a plurality of pixels disposed in the display region and arranged in an array; and
- a plurality of micro light-emitting diode structures disposed in the pixels and electrically bonded to the driving substrate, wherein each of the micro light-emitting diode structures comprises:
  - an epitaxial layer;
  - a reflecting layer disposed on the epitaxial layer;
  - a patterned electrode layer disposed between the epitaxial layer and the reflecting layer, wherein the patterned electrode layer is divided into a plurality of patterned electrode segments, and the patterned electrode segments are separated from each other; and
  - a first-type electrode and a second-type electrode disposed on the reflecting layer and electrically connected to the epitaxial layer.

19. The micro light-emitting diode display panel according to claim 18, wherein the epitaxial layer comprises:
- a first-type semiconductor layer having a first conductivity type;
- a light-emitting layer disposed on the first-type semiconductor layer; and
- a second-type semiconductor layer disposed on the light-emitting layer and having a second conductivity type that is the opposite of the first conductivity type, wherein the reflecting layer has a rough top surface, and the first-type semiconductor layer has a patterned light-emitting surface.

20. The micro light-emitting diode display panel according to claim 19, wherein the rough top surface is opposite the patterned electrode layer, and the patterned light-emitting surface is opposite the driving substrate.

* * * * *